United States Patent
Kokuda

(10) Patent No.: US 10,367,051 B2
(45) Date of Patent: Jul. 30, 2019

(54) ACTIVE-MATRIX DISPLAY DEVICE

(71) Applicant: JOLED INC., Tokyo (JP)

(72) Inventor: Kenji Kokuda, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/011,792

(22) Filed: Jun. 19, 2018

(65) Prior Publication Data

US 2019/0051717 A1    Feb. 14, 2019

(30) Foreign Application Priority Data

Aug. 8, 2017    (JP) .................................. 2017-153480

(51) Int. Cl.
*H01L 27/32* (2006.01)
(52) U.S. Cl.
CPC ...... *H01L 27/3276* (2013.01); *H01L 27/3211* (2013.01); *H01L 27/3262* (2013.01)
(58) Field of Classification Search
CPC ............ H01L 27/3297; H01L 23/5286; H01L 2027/11881; H01L 27/3276; H01L 27/3262; H01L 27/3211
See application file for complete search history.

(56) References Cited

U.S. PATENT DOCUMENTS

| | | | |
|---|---|---|---|
| 6,380,688 B1* | 4/2002 | Bae ...................... | G09G 3/3233 315/169.3 |
| 2006/0208158 A1* | 9/2006 | Masashi ............... | H04N 3/1568 250/208.1 |
| 2009/0278837 A1* | 11/2009 | Schwanenberger ........................ | G09G 3/3233 345/214 |
| 2017/0309696 A1 | 10/2017 | Ebisuno et al. | |

FOREIGN PATENT DOCUMENTS

JP    2017-198809    11/2017

* cited by examiner

*Primary Examiner* — Thanh Y. Tran
(74) *Attorney, Agent, or Firm* — Greenblum & Bernstein, P.L.C.

(57) ABSTRACT

An active-matrix display device includes: a pixel matrix that includes a plurality of pixel cells arranged in rows and columns; a first global power supply wire that is disposed for each of the columns in the pixel matrix and connected to each of the plurality of pixel cells in the column; and a second global power supply wire that is disposed for each of the columns in the pixel matrix and connected to each of the plurality of pixel cells in the column. Each of the plurality of pixel cells includes a local power supply wire that is connected to the first global power supply wire, and the local power supply wire does not overlap the second global power supply wire in a plan view of the pixel matrix.

3 Claims, 8 Drawing Sheets

ACTIVE-MATRIX DISPLAY DEVICE

CROSS REFERENCE TO RELATED APPLICATION

The present application is based on and claims priority of Japanese Patent Application No. 2017-153480 filed on Aug. 8, 2017. The entire disclosure of the above-identified application, including the specification, drawings and claims is incorporated herein by reference in its entirety.

FIELD

The present disclosure relates to an active-matrix display device.

BACKGROUND

Conventionally, an active-matrix display device that includes a pixel matrix including a plurality of pixel cells arranged in rows and columns has been known (for example, see Patent Literature (PTL) 1).

In general, it is necessary to supply a plurality of power supplies having mutually different potentials to pixel cells of an active-matrix display device. Therefore, the active-matrix display device includes, for each column in the pixel matrix, a plurality of global power supply wires that are connected to respective pixel cells in the column.

Moreover, an active-matrix display device is configured by stacking two or more wiring layers and the insulating layers between the wiring layers, so that two or more wires that transmit mutually different signals or power supplies can be arranged to allow the wires to intersect with each other in a plan view of the pixel matrix.

CITATION LIST

Patent Literature

[PTL 1] Japanese Patent Application No. 2016-088524

SUMMARY

Technical Problem

In the plan view of the pixel matrix, when there is an intersection area where a first wire and a second wire intersect with each other, there is a possibility of a foreign substance being introduced in the portion of the insulating layer between the first wire and the second wire in the intersection area during the manufacturing process of an active-matrix display device. Furthermore, this may break down the insulation between the first wire and the second wire, and cause a short circuit between the first wire and the second wire. Generation of such short circuit decreases a yield of an active-matrix display device.

In view of the above, the present disclosure has an object to provide an active-matrix display device capable of further suppressing the decrease in the yield as compared with a conventional one.

Solution to Problem

An active-matrix display device according to an aspect of the present disclosure includes: a pixel matrix that includes a plurality of pixel cells arranged in rows and columns; a first global power supply wire that is disposed for each of the columns in the pixel matrix and is connected to each of the plurality of pixel cells in the column; and a second global power supply wire that is disposed for each of the columns in the pixel matrix and is connected to each of the plurality of pixel cells in the column. Each of the plurality of pixel cells includes a local power supply wire that is connected to the first global power supply wire, and the local power supply wire does not overlap the second global power supply wire in a plan view of the pixel matrix.

Advantageous Effects

According to the active-matrix display device having the above configuration, the decrease in the yield can be further suppressed compared with a conventional one.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENT

Hereinafter, an embodiment of an active-matrix display device according to the present disclosure is described with reference to the drawings. Each embodiment described below shows an example of the present disclosure. Therefore, the numerical values, structural elements, and the arrangement and connection of the structural elements, for instance, presented in the following embodiment are mere examples, and thus are not intended to limit the present disclosure. Therefore, among the structural elements in the embodiment below, structural elements not recited in any one of independent claims which indicate the broadest concepts of the present disclosure are described as optional structural elements.

In the respective drawings, the same reference sign is given to substantially identical structural elements. Note also that each of the drawings is only a schematic diagram and is not necessarily precise representation of, for example, the film thicknesses and the ratio of the sizes of the structural elements.

Embodiment

[1. Overall Configuration]

Figure 1:
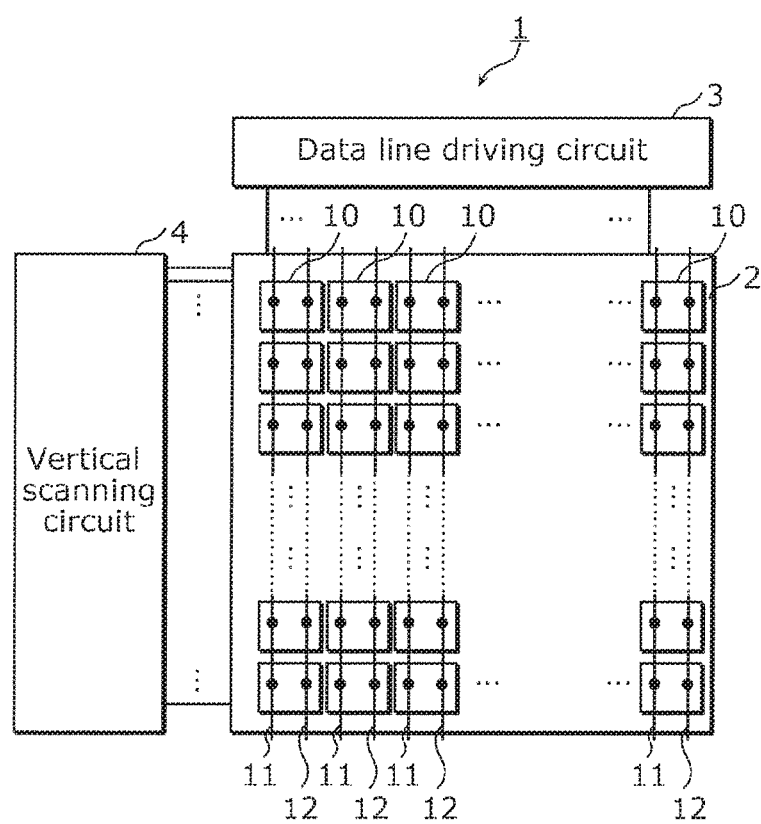
FIG. 1 is a block diagram illustrating a configuration of an active-matrix display device according to an embodiment.

FIG. 1 is a block diagram illustrating a configuration of an active-matrix display device 1 according to an embodiment.

As illustrated in FIG. 1, the active-matrix display device 1 includes: a pixel matrix 2 that includes a plurality of pixel cells 10 arranged in rows and columns; a data line driving circuit 3; a vertical scanning circuit 4; a first global power supply wire 11 that is disposed for each of the columns in the pixel matrix 2 and is connected to each of the plurality of pixel cells 10 in the column; and a second global power supply wire 12 that is disposed for each of the columns in the pixel matrix and is connected to each of the plurality of pixel cells 10 in the column.

Figure 2:
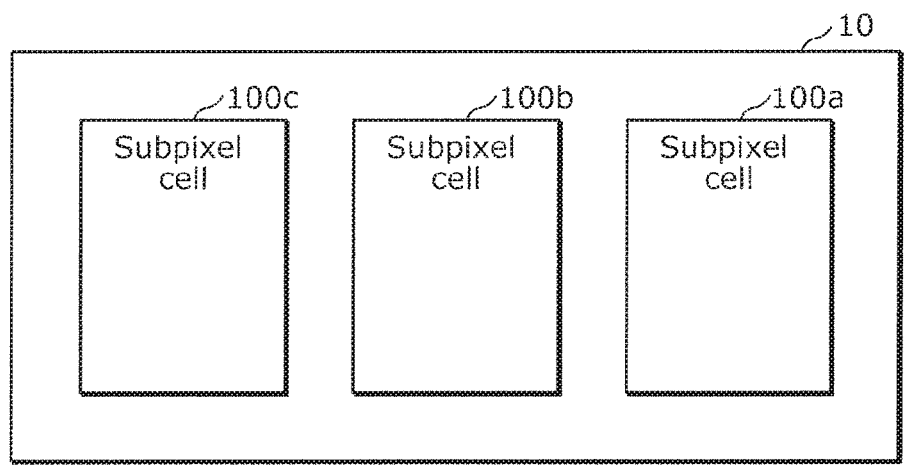
FIG. 2 is a block diagram illustrating a configuration of a pixel cell according to the embodiment.

FIG. 2 is a block diagram illustrating a configuration of each pixel cell 10.

As illustrated in FIG. 2, the pixel cell 10 includes: a subpixel cell 100a that emits red light, a subpixel cell 100b that emits green light, and a subpixel cell 100c that emits blue light. Hereinafter, when the subpixel cell 100a, the subpixel cell 100b, and the subpixel cell 100c do not need to be explicitly distinguished from one another, the subpixel cell 100a, the subpixel cell 100b, and the subpixel cell 100c may also be simply referred to as a subpixel cell 100 or subpixel cells 100.

Figure 3:
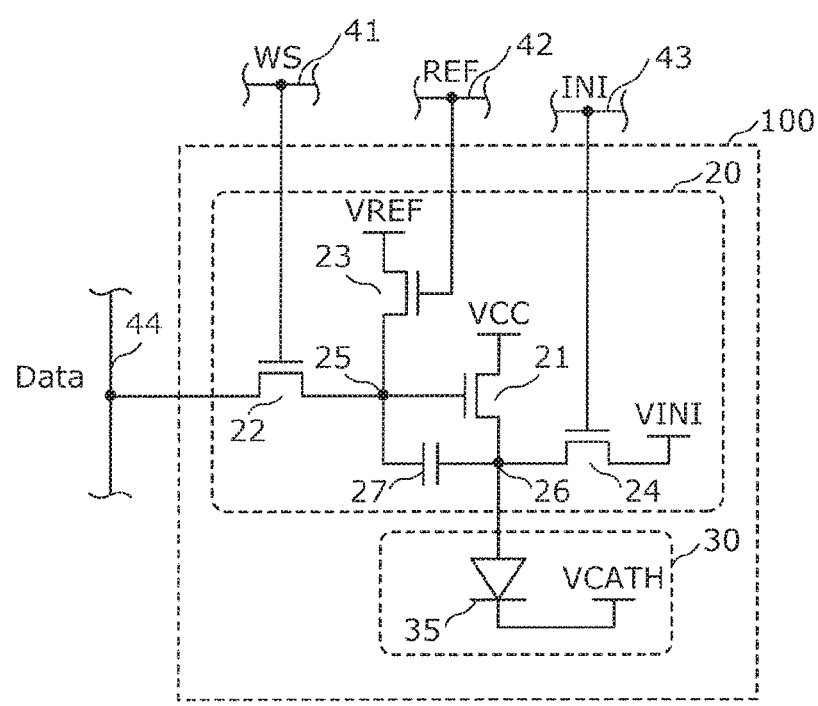
FIG. 3 is a block diagram illustrating a circuit configuration of a subpixel cell according to the embodiment.

FIG. 3 is a block diagram illustrating the circuit configuration of the subpixel cell 100.

As illustrated in FIG. 3, the subpixel cell 100 includes a circuit unit 20 and a light emitting unit 30.

The circuit unit 20 includes a drive transistor 21, a switch transistor 22, a reference voltage transistor 23, an initialization transistor 24, a gate node 25, a source node 26, and a holding capacitor 27. Furthermore, the light emitting unit 30 includes a light-emitting element 35.

The switch transistor 22 has a gate terminal that is connected to a scanning line 41. The switch transistor 22 sets the potential of the gate node 25 to the data voltage of a data line 44 at the timing when the signal (WS) of the scanning line 41 is a logical value of 1. In other words, the switch transistor 22 writes the data voltage of the data line 44 into the holding capacitor 27 at the timing when the signal (SW) of the scanning line 41 is the logical value of 1.

The drive transistor 21 has a gate terminal that is connected to the gate node 25, a source terminal that is connected to the light-emitting element 35 (i.e., connected to the source node 26), and a drain terminal that is connected to a power supply VCC. With this configuration, the drive transistor 21 converts the data voltage that is set in the gate terminal via the switch transistor 22 into a signal current corresponding to the data voltage, and drives the light-emitting element 35 with the converted signal current. In other words, the drive transistor 21 drives the light-emitting element 35 with the driving capability corresponding to the data voltage written in the holding capacitor 27.

The holding capacitor 27 holds capacitance between the gate node 25 and the source node 26. In the case where the switch transistor 22 is changed from an ON state to an OFF state after the data voltage of the data line 44 is set in the gate node 25 by the switch transistor 22 when it is in the ON state, the holding capacitor 27 maintains the potential of the gate node 25 at the data voltage. This enables the drive transistor 21 to continue driving the light-emitting element 35 with a signal current corresponding to the data voltage set by the switch transistor 22 when it is in the ON state, even after the drive transistor 21 is changed to the OFF state.

The reference voltage transistor 23 has a gate terminal that is connected to a reference voltage control line 42. The reference voltage transistor 23 sets the potential of the gate node 25 to a reference voltage VREF at the timing when the signal (REF) of the reference voltage control line 42 is the logical value of 1.

The initialization transistor 24 has a gate terminal that is connected to an initialization control line 43, and initializes the potential of the source node 26 to an initializing voltage VINI at the timing when the signal (INI) of the initialization control line 43 is the logical value of 1.

The light-emitting element 35 is an element that emits light corresponding to the current amount of the signal current converted by the drive transistor 21. In other words, the light-emitting element 35 emits light with an amount of light corresponding to the driving capability of the drive transistor 21. Here, the light-emitting element 35 is an organic EL element, for example. However, the light-emitting element 35 does not necessarily need to be limited to the example of an organic EL element. For example, other examples may be considered in which the light-emitting element 35 is a light emitting diode, etc.

Figure 4:
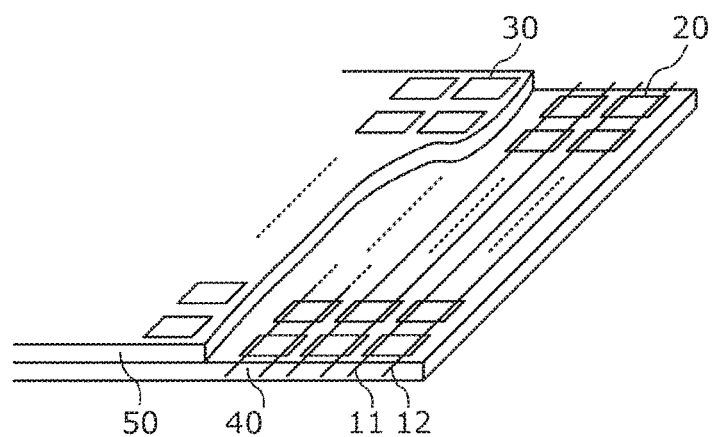
FIG. 4 is a partial cut-out perspective view of a pixel matrix according to the embodiment.

FIG. 4 is a partial cut-out perspective view of the pixel matrix 2.

As illustrated in FIG. 4, in each pixel cell 10 included in the pixel matrix 2, the circuit unit 20 is arranged in a transistor configuration region 40 positioned on the lower layer side in a plan view of the pixel matrix 2, and the light emitting units 30 are arranged in an organic EL element configuration region 50 positioned on the upper layer side in the plan view of the pixel matrix 2.

The organic EL element configuration region 50 is the top layer in the plan view of the pixel matrix 2. Therefore, as illustrated in FIG. 4, the light-emitting elements 35 are arranged in an array on the surface of the pixel matrix 2. Accordingly, a display screen that displays an image is formed on the surface of the pixel matrix 2. For example, when the pixel matrix 2 includes the pixel cells 10 arranged in rows and columns, that is, 1080 rows×1920 columns, a display screen that displays an image of a full hi-vision size is formed on the surface of the pixel matrix 2.

Referring back to FIG. 1, the configuration of the active-matrix display device 1 is further described.

For the pixel matrix 2, the vertical scanning circuit 4 controls the operation of each pixel cell 10 on per a row basis via control signal lines (not illustrated) each shared on per a row basis.

The data line driving circuit 3 operates in synchronization with the vertical scanning circuit 4. The data line driving circuit 3 supplies, to each of data lines (not illustrated), on a per row basis controlled by the vertical scanning circuit 4, the gate voltage for writing into the holding capacitors 27 of the pixel cells 10 in the row.

[2. Power Supply Configuration of Pixel Cell]

Hereinafter, a power supply configuration of the pixel cell 10 is described with reference to the drawings.

Figure 5:
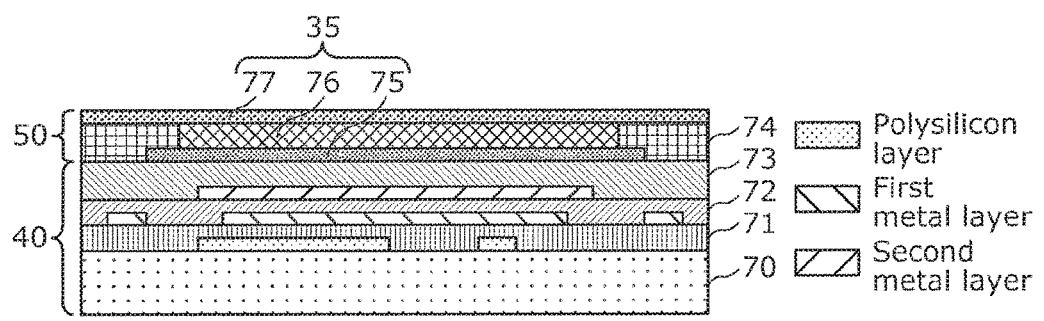
FIG. 5 is a cross-sectional view illustrating a layout structure of the pixel cell according to the embodiment.

FIG. 5 is a cross-sectional view of a plane perpendicular to the horizontal plane of the pixel matrix 2, illustrating the layout structure of the pixel cell 10.

As illustrated in FIG. 5, in the pixel cell 10, the transistor configuration region 40 includes, on the substrate 70, a polysilicon layer, a gate insulation film 71, a first metal layer, a first interlayer insulation film 72, a second metal layer, and a second interlayer insulation film 73 that are stacked in stated order from the lower layer side to the upper layer side. Furthermore, in the pixel cell 10, the organic EL element configuration region 50 includes, on the second interlayer insulation film 73, an anode 75, an organic light-emitting layer 76, a transparent cathode 77 that are stacked in stated order from the lower layer side to the upper layer side, and a bank 74 disposed between adjacent subpixel cells 100.

Figure 6:
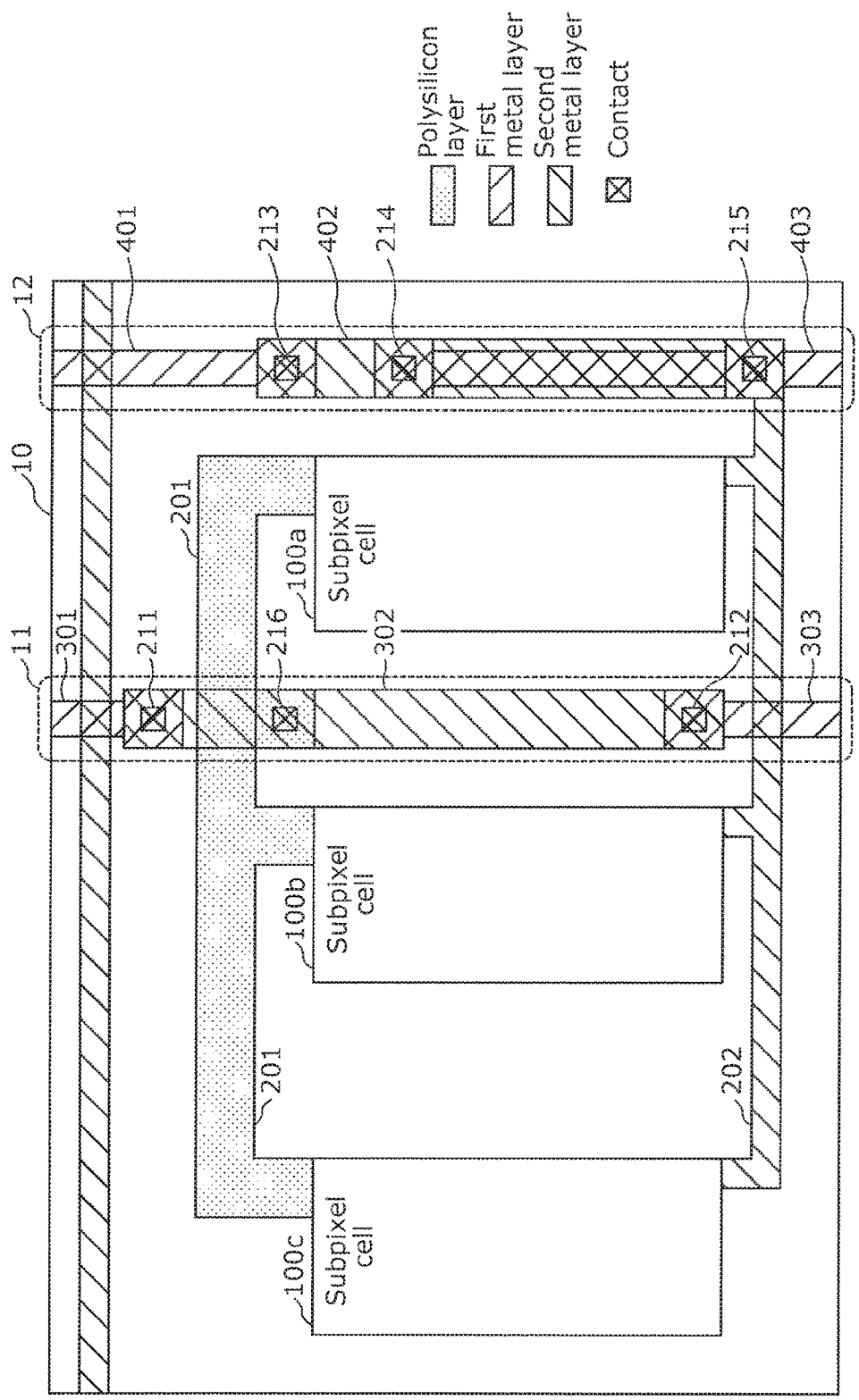
FIG. 6 is a schematic diagram illustrating a power supply wiring structure of the pixel cell according to the embodiment.

FIG. 6 is a schematic diagram illustrating a power supply wiring structure of the pixel cell 10. Hereinafter, the upper side in FIG. 6 is referred to as upper or above, and the lower side in FIG. 6 is referred to as lower or below for convenience.

As illustrated in FIG. 6, the pixel cell 10 includes a first local power supply wire 201 and a second local power supply wire 202 as power supply wires in the pixel cell 10.

The first global power supply wire 11 passes through the pixel cell 10 in the column direction.

The first global power supply wire 11 includes: a first metal wire 301 that connects the upper end of the pixel cell 10 and the contact 211, and is formed from the first metal layer; a second metal wire 302 that connects the contact 211, a contact 212, and a contact 216, and is formed from the second metal layer; and a first metal wire 303 that connects the contact 212 and a lower end of the pixel cell 10, and is formed from the first metal layer. As illustrated in FIG. 6, the upper end and the lower end of the first global power supply wire 11 in the pixel cell 10 are connected via the series connection of the first metal wire 301, the second metal wire 302, and the first metal wire 303. The upper end and the lower end of the first global power supply wire 11 in the pixel cell 10 are connected not only by a single first metal wire.

Moreover, the position of the first global power supply wire 11 in the row direction at the upper end of the pixel cell 10 and the position of the first global power supply wire 11 in the row direction at the lower end of pixel cell 10 are aligned with each other.

As described above, the pixel cells 10 are arranged in rows and columns in the pixel matrix 2. Therefore, the upper end of the pixel cell 10 in the first global power supply wire 11 continues to the lower end of a pixel cell 10 adjacent above in the same column in the pixel matrix 2. Similarly, the lower end of the pixel cell 10 in the first global power supply wire 11 continues to the upper end of a pixel cell 10 adjacent below in the same column in the pixel matrix 2.

Moreover, the first global power supply wire 11 is connected to the first local power supply wire 201 via the contact 216.

The first local power supply wire 201 supplies the power supply voltage supplied from the first global power supply wire 11 to the subpixel cell 100a, the subpixel cell 100b, and the subpixel cell 100c. The first local power supply wire 201 is implemented by a polysilicon layer. In other words, the first local power supply wire 201 is a polysilicon wire.

As illustrated in FIG. 6, the first local power supply wire 201 does not overlap the second global power supply wire 12 in the plan view of the pixel matrix 2.

The second global power supply wire 12 passes through the pixel cell 10 in the column direction.

The second global power supply wire 12 includes: a first metal wire 401 that connects the upper end of the pixel cell 10 and the contact 213, and is formed from the first metal layer; a second metal wire 402 that connects the contact 213, the contact 214, and the contact 215, and is formed from the second metal layer; and a first metal wire 403 that connects the contact 214, the contact 215, and the lower end of the pixel cell 10, and is formed from the first metal layer. As illustrated in FIG. 6, the upper end and the lower end of the second global power supply wire 12 in the pixel cell 10 are connected via the series connection of the first metal wire 401 and the second metal wire 402 and the first metal wire 403. The upper end and the lower end of the second global power supply wire 12 in the pixel cell 10 are connected not only by a single first metal wire.

Moreover, the position of the second global power supply wire 12 in the row direction at the upper end of the pixel cell 10 and the position of the second global power supply wire 12 in the row direction at the lower end of the pixel cell 10 are aligned with each other.

Therefore, as with the first global power supply wire 11, the upper end of the pixel cell 10 in the second global power supply wire 12 continues to the lower end of a pixel cell 10 adjacent above in the same column in the pixel matrix 2. Similarly, the lower end of the pixel cell 10 in the second global power supply wire 12 continues to the upper end of a pixel cell 10 adjacent below in the same column of the pixel cell 10 in the pixel matrix 2.

Furthermore, the second global power supply wire 12 is connected to the second local power supply wire 202 via the contact 215.

The second local power supply wire 202 supplies the power supply voltage supplied from the second global power supply wire 12 to the subpixel cell 100a, the subpixel cell 100b, and the subpixel cell 100c. The second local power supply wire 202 is implemented by the first metal wire that is formed from the first metal layer.

[3. Consideration]

Hereinafter, the active-matrix display device 1 having the aforesaid configuration is considered.

As described above, in the active-matrix display device 1 according to the above embodiment, the first local power supply wire 201 does not overlap the second global power supply wire 12 in the plan view of the pixel matrix 2. Therefore, in the active-matrix display device 1 according to the above embodiment, a short circuit between the first local power supply wire 201 and the second global power supply wire 12 is suppressed. Therefore, the active-matrix display device 1 according to the embodiment is capable of further suppressing the decrease in the yield compared with the conventional one.

Moreover, as described above, in the active-matrix display device 1 according to the above embodiment, the upper end and the lower end of the second global power supply wire 12 in the pixel cell 10 are connected not only by a single first metal wire. Therefore, the length of the single first metal wire in the second global power supply wire 12 does not exceed the length of the pixel cell 10 in the column direction regardless of the number of pixel cells 10 arranged in the column direction in the pixel matrix 2. This restricts the amount of the electric charge collected to the single first metal wire included in the second global power supply wire 12 during the manufacturing process, etc. of the active-matrix display device 1. Thus, the electrostatic discharge damages of the insulators (for example, the gate insulation film 71, the first interlayer insulation film 72, etc.) around the single first metal wire included in the second global power supply wire 12 is suppressed. Therefore, the active-matrix display device 1 according to the embodiment is capable of further suppressing the decrease in the yield compared with the conventional one.

Variation

Although the active-matrix display device according to the present disclosure has been described based on the embodiment above, the present disclosure is not limited to the embodiment described above. Other variations implemented through various changes and modifications conceived by a person of ordinary skill in the art and various kinds of equipment having the active-matrix display device according to the present disclosure may be included in the scope in an aspect or aspects according to the present disclosure, unless such changes, modifications, and equipment depart from the scope of the present disclosure.

In the embodiment, it has been described that the number of subpixel cells 100 included in one pixel cell 10 is three. However, the number of subpixel cells 100 included in one pixel cell 10 is not limited to three as long as at least one subpixel cell 100 is included. For example, it is possible to have a configuration in which four subpixel cells 100 are included in one pixel cell 10.

Furthermore, in the embodiment, it has been described that the subpixel cell 100a emits red light, the subpixel cell 100b emits green light, and the subpixel cell 100c emits blue light. However, the combination of the colors of light emitted by the subpixel cells 100 is not limited to the aforesaid combination. For example, it is possible to have a configuration in which the subpixel cell 100a emits cyan light, the subpixel cell 100b emits magenta light, and the subpixel cell 100e emits yellow light.

Furthermore, in the embodiment, the second local power supply wire 202 of each pixel cell 10 has been described with reference to FIG. 6 which is illustrated as if the second local power supply wire 202 is not connected to a second local power supply wire 202 of an adjacent pixel cell 10 in the row direction. However, the configuration of the second local power supply wire 202 of each pixel cell 10 is not necessarily limited to the example of the configuration in which the second local power supply wire 202 is not connected to a second local power supply wire 202 of a pixel cell 10 adjacent in the row direction.

Figure 7:
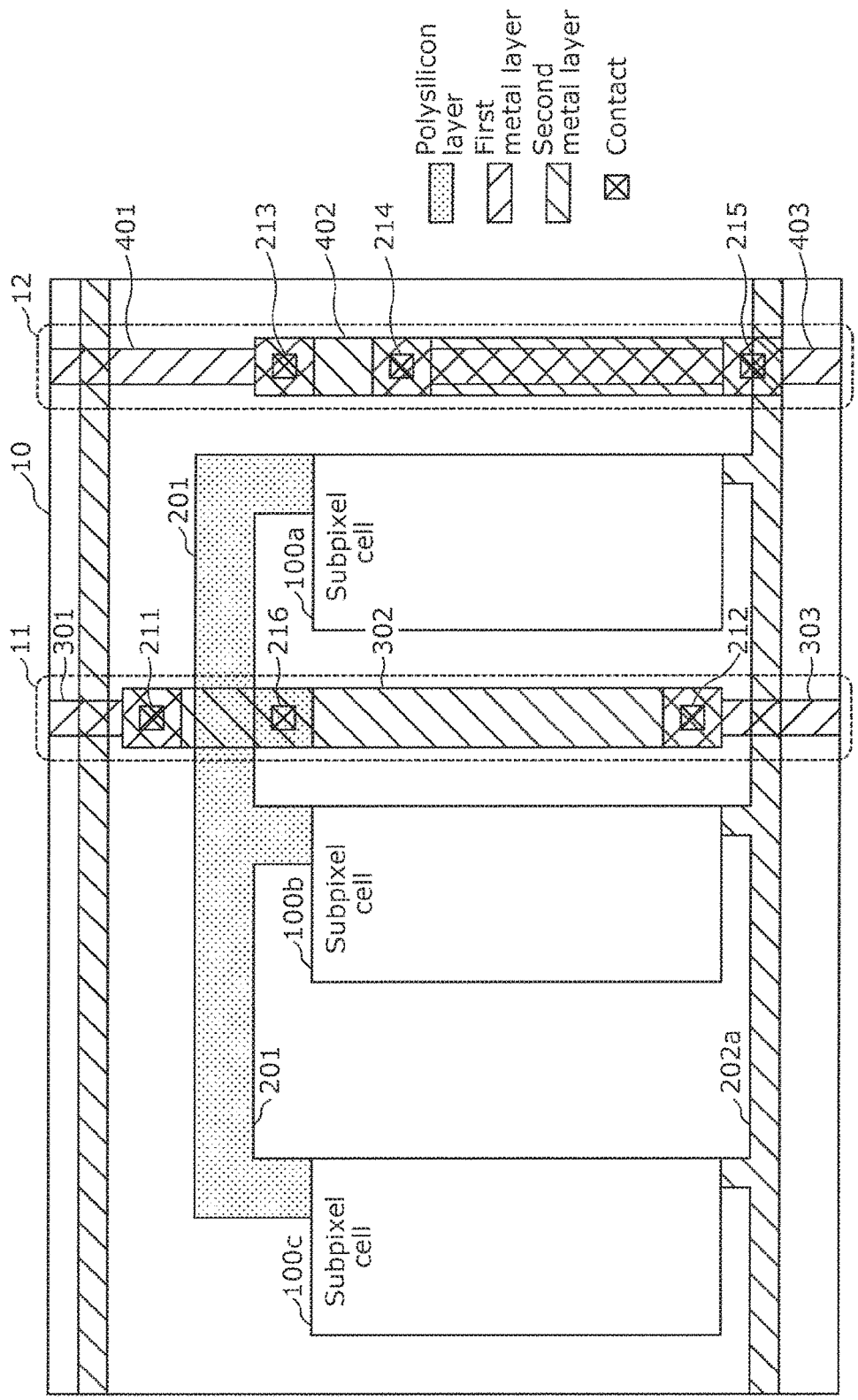
FIG. 7 is a schematic diagram illustrating a power supply wiring structure of a pixel cell according to a variation.

For example, as illustrated in FIG. 7, the second local power supply wire 202a of each pixel cell 10 may be connected to a second local power supply wire 202a of a pixel cell 10 adjacent in the row direction.

Figure 8:
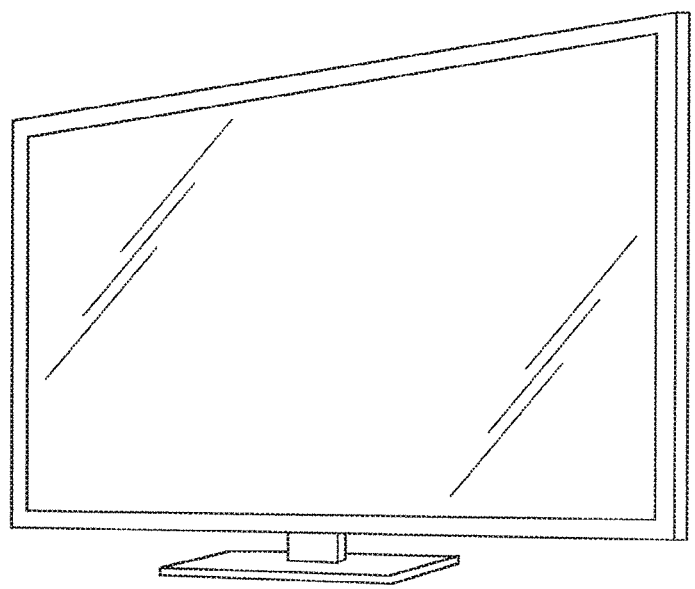
FIG. 8 is an external view of a flat display device according to the variation.

Moreover, for example, the active-matrix display device according to the present disclosure is implemented as a flat display device as illustrated in FIG. 8. FIG. 8 is an external view of a flat display device. Such a flat display device is capable of further suppressing the decrease in the yield compared with the conventional one.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is widely applicable to an active-matrix display device that includes a pixel matrix including a plurality of pixel cells arranged in rows and columns, for example.

The invention claimed is:
1. An active-matrix display device, comprising:
a pixel matrix that includes a plurality of pixel cells arranged in rows and columns;
a first global power supply wire that is disposed for each of the columns in the pixel matrix and is connected to each of the plurality of pixel cells in the column; and
a second global power supply wire that is disposed for each of the columns in the pixel matrix and is connected to each of the plurality of pixel cells in the column,
wherein each of the plurality of pixel cells includes a first local power supply wire that is directly connected to the first global power supply wire,
each of the plurality of pixel cells includes a second local power supply wire that is directly connected to the second global power supply wire,
all of the plurality of pixel cells in each column are connected to both the first global power supply wire and the second global power supply wire, and
the first local power supply wire does not overlap the second global power supply wire in a plan view of the pixel matrix.
2. The active-matrix display device according to claim 1, wherein each of the first global power supply wire and the second global power supply wire includes a metal wire, and
the first local power supply wire includes a polysilicon wire.
3. The active-matrix display device according to claim 1, wherein the second global power supply wire includes
a first metal wire that is formed from a first metal wiring layer; and
a second metal wire that is formed from a second metal wiring layer disposed higher than the first metal wiring layer,
wherein an end and another end in a column direction of the second global power supply wire in a region passing through one of the plurality of pixel cells in the column direction are connected not only by the first metal wire.

* * * * *